United States Patent [19]

Watt

[11] 4,017,717

[45] Apr. 12, 1977

[54] RESOLUTION OF AMBIGUITIES IN COUNTS CONTAINED IN OVERLAPPING BIT POSITIONS OF FINE AND COARSE DATA MEASUREMENT DIGITAL SIGNALS

[75] Inventor: Richard Edwin Watt, San Diego, Calif.

[73] Assignee: Cubic Corporation, San Diego, Calif.

[22] Filed: June 25, 1976

[21] Appl. No.: 699,673

[52] U.S. Cl. .................... 235/92 CA; 235/92 PS; 235/92 R; 340/347 AD
[51] Int. Cl.² ........................................ G06M 3/10
[58] Field of Search ...... 235/92 PS, 92 CA, 92 MP; 340/347 SY, 347 AD

[56] References Cited

UNITED STATES PATENTS

| | | | |
|---|---|---|---|
| 2,991,462 | 7/1961 | Hose | 340/347 SY |
| 3,223,830 | 12/1965 | Evans | 340/347 SY |
| 3,277,461 | 10/1966 | Selvin | 340/347 SY |
| 3,529,136 | 9/1970 | Offereins | 235/92 CA |

*Primary Examiner*—Joseph M. Thesz
*Attorney, Agent, or Firm*—Brown & Martin

[57] ABSTRACT

Ambiguities in counts contained in overlapping bit positions of fine and coarse data measurement digital signals that are combined to provide a composite digital signal representative of a measured quantity, such as distance or angle, are resolved by comparing the counts in the most significant overlapping bit position of the fine and coarse data signals and comparing the counts in the next lesser significant overlapping bit positions of the fine and coarse data signals; and by adjusting the count in the non-overlapping more significant bit positions of the coarse data signal in accordance with such comparisons.

The count in the non-overlapping more significant bit positions of the coarse data signal is reduced by one bit when the count in the most significant overlapping bit position of the fine data signal is greater than the count in the most significant overlapping bit position of the coarse data signal, and the count in the next lesser significant bit positions of the fine data signal is greater than the count in the next lesser significant bit positions of the coarse data signal; and the count in the non-overlapping more significant bit positions of the coarse data signal is increased by one bit when the respective compared counts in the fine data signal are both less than the corresponding compared counts in the coarse data signal.

4 Claims, 10 Drawing Figures

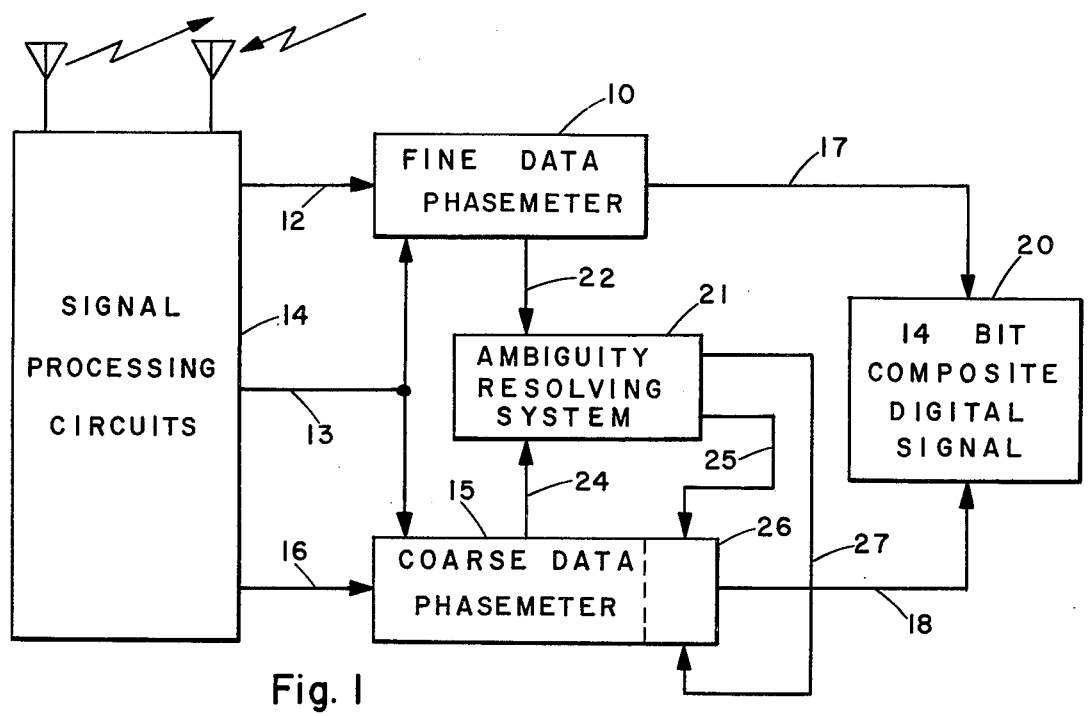
Fig. 1
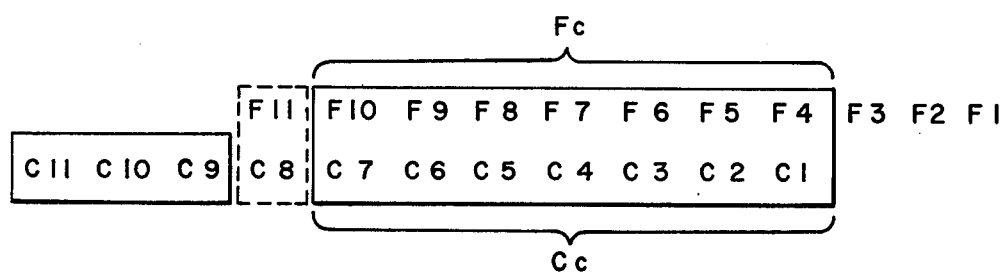
Fig. 4
| F11 | C8 | COMPARISON OF Fc & Cc | ADJUSTMENT TO COUNT IN DATA BIT POSITIONS C9, C10 & C11 |
|---|---|---|---|
| 1 | 1 | IRRELEVANT | NONE |
| 0 | 0 | IRRELEVANT | NONE |
| 1 | 0 | Fc > Cc | -1 COUNT |
| 1 | 0 | Fc < Cc | NONE |
| 0 | 1 | Fc > Cc | NONE |
| 0 | 1 | Fc < Cc | +1 COUNT |
Fig. 5

RESOLUTION OF AMBIGUITIES IN COUNTS CONTAINED IN OVERLAPPING BIT POSITIONS OF FINE AND COARSE DATA MEASUREMENT DIGITAL SIGNALS

BACKGROUND OF THE INVENTION

The present invention pertains to measuring systems wherein measurement data is provided by digital signals, and is particularly directed to an improvement in a system for resolving ambiguities in counts contained in overlapping bit positions of fine data and coarse data signals that are combined to form a composite digital signal representative of a measured quantity.

Such measuring systems are employed in the measurement of range (distance) or angle. In a typical prior art distance measuring apparatus, at least two related continuous wave signals having related ranging tones (frequencies) are used to produce resolution of range and maximum ranging capability. These two tone signals are used to frequency modulate a carrier signal which is transmitted to a transponder device in a vehicle or object as to which the range is being measured. The distance measuring apparatus receives the original two signals from the transponder on a different carrier frequency, with phase shifts in the received signals being equal to the round trip phase shifts, which are proportioned to the distance travelled.

For purposes of illustration a typical two-tone system is discussed. A 988 Hz tone signal is used for gathering coarse measurement data and a 7,904.1 Hz tone signal is used for gathering fine measurement data. The distance measuring apparatus includes digital phasemeters which translate the received tone signals into two 11 bit data signals. The 7,904.1 Hz tone is equal to 10.24 nautical miles per cycle. Thus the fine data signal translated from this tone signal is an 11 bit digital signal having a least significant bit position representing 0.005 nautical miles. For the 988 Hz tone the distance per cycle is eight times that of the 7,904.1 Hz tone, or 81.92 nautical miles per cycle; and the least significant bit position of the coarse data signal translated from the 988 Hz tone signal represents 0.04 nautical miles. The distances represented by the bit positions of the fine data and coarse data signals and the extent to which they overlap is as follows.

| Distance (n.mi.) | | | 40.96 | 20.48 | 10.24 | 5.12 | 2.56 | |
|---|---|---|---|---|---|---|---|---|
| Fine Data Signal | | | | | | X | X | X |
| Coarse Data Signal | X | X | X | X | X | X | X | X |
| 1.28 | 0.64 | 0.32 | 0.16 | 0.08 | 0.04 | 0.02 | 0.01 | 0.005 |
| X | X | X | X | X | X | X | X | X |
| X | X | X | X | X | X | | | |

If it were not for such factors that affect the accuracy of measured data as system noise generated in the receiver, transmitter, transponder and in the free space propagation of the modulated signals, and multipath phase errors, the three more significant non-overlapping bits of the coarse data signal could simply be added to the eleven bits of the fine data signal to form a composite 14 bit digital signal representative of the measured phase shift. However, these factors do affect the accuracy of the measured data and their effect is greater in the coarse data signal. Thus before the composite digital signal is assembled it is necessary to compare the counts contained in the overlapping bit positions of the fine data and coarse data signals and to resolve an ambiguity in these counts by adjusting the count in the non-overlapping bit positions of the coarse data signal in accordance with such comparison.

In the prior art systems such an ambiguity is resolved by subtracting the count in the overlapping bit positions of the coarse data signal from the count in the overlapping bit positions of the fine data signal to determine the magnitude of the difference and then adding the difference to the coarse data signal, whereupon a carry, if generated would propagate into the more significant bit positions of the coarse data signal. This resolution process presents no particular problem where a computer is available to make such computations. However, range measuring apparatus are commonly employed in the field or in aircraft where no computer is available and/or where adjustments for any inaccuracies in the coarse data signal must be made immediately without time for computer entry.

An analogous problem of resolving ambiguities in overlapping fine data and coarse data signals occurs with angle measuring apparatus wherein several antenna pairs are used on each baseline. In this case the direction cosine information from different antenna pairs is overlapped in the same way as the range data in distance measuring apparatus, and a similar need for adjustment exists.

SUMMARY OF THE INVENTION

The present invention provides an alternative system for resolving an ambiguity in the counts contained in overlapping bit positions of the fine data and coarse data signals that does not necessitate arithmetic operations such as are performed with a computer. Accordingly, the ambiguity resolving system of the present invention compares the counts in the most significant overlapping bit position of the fine data and coarse data signals, and compares the counts in the next lesser significant overlapping bit positions of the fine data and coarse data signals. Upon making these comparisons, the ambiguity resolving system reduces the count in the non-overlapping more significant bit positions of the coarse data signal by one bit when the count in the most significant overlapping bit position of the fine data signal is greater than the count in the most significant overlapping bit position of the coarse data signal and the count in the next lesser significant bit positions of the fine data signal is greater than the count in the next lesser significant bit positions of the coarse data signal; and increases the count in the non-overlapping more significant bit positions of the coarse data signal by one bit when the count in the most significant overlapping bit position of the fine data signal is less than the count in the most significant overlapping bit position of the coarse data signal and the count in the next lesser significant bit positions of the fine data signal is less than the count in the next lesser significant bit positions of the coarse data signal.

BRIEF DESCRIPTION OF THE DRAWING

FIG. 1 is a block diagram of a distance measuring apparatus including the ambiguity resolving system of the present invention.

FIG. 4 is a chart illustrating the relative bit positions of overlapping fine data and coarse data signals.

FIG. 5 is a table stating the adjustments to be made to the count contained in the more significant bit positions of the coarse data signal in response to various differences detected upon comparison of the counts in the overlapping bit positions of the fine data and coarse data signals.

DESCRIPTION OF THE PREFERRED EMBODIMENT

Figure 3:
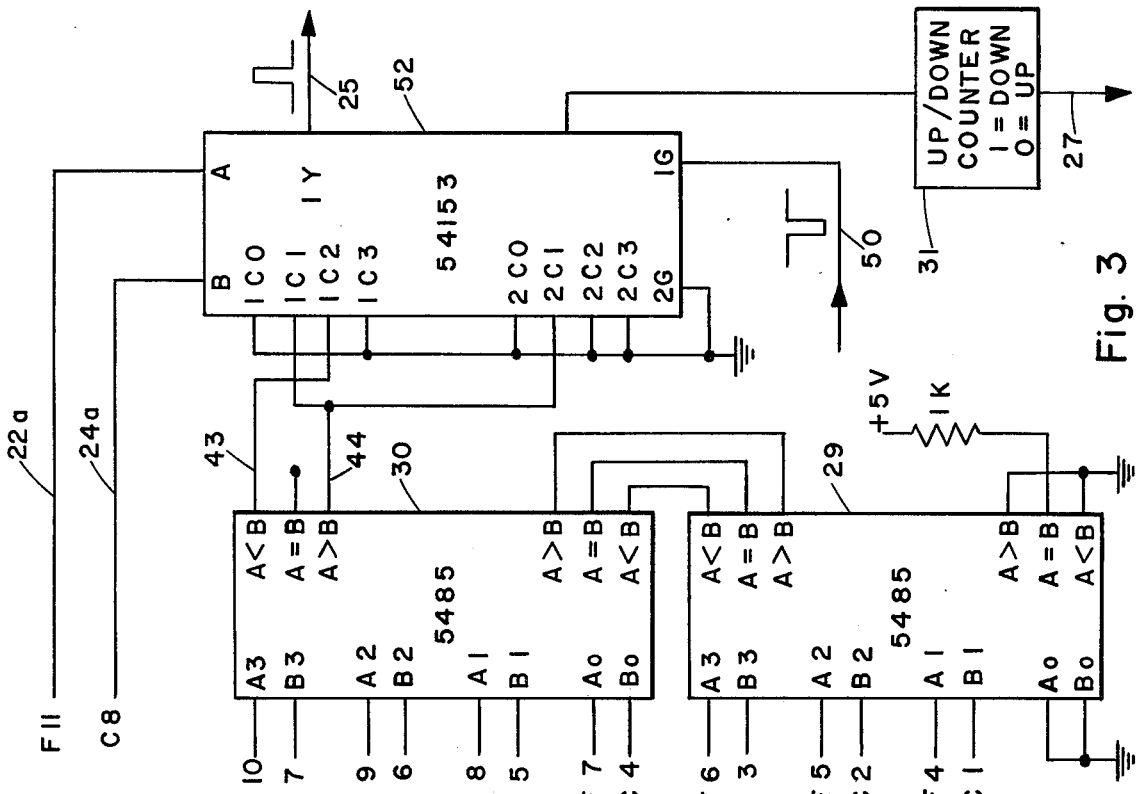
FIG. 3 is a schematic circuit diagram of an alternative preferred embodiment of the ambiguity resolving system of the present invention.

In the distance measuring apparatus of FIG. 1, a phasemeter 10 produces a fine data signal that is registered therein in response to measuring the difference in phase between a ranging tone signal providing fine measurement data on line 12 and a reference tone signal provided on line 13 from signal processing circuits 14, in which the ranging tone signals are processed to enable measurement of the phase shift between the transmitted and received tone signals. Similarly a second phasemeter 15 measures the phase shift between the reference tone signal on line 13 and a tone signal providing coarse measurement data on line 16 and produces a coarse data signal that is registered in the phasemeter 15.

The fine data signal is a digital signal having 11 bit positions. The coarse data signal is also a digital having 11 bit positions. The coarse data signal has eight bit positions that overlap the fine data signal and three more significant non-overlapping bit positions that provide coarse measurement data. The 11 bit fine data signal is provided on line 17 and combined with the three more significant bits of the coarse data signal provided on line 18 to form a 14 bit composite digital signal at an output 20 to provide a representation of the measured phase shift, which is proportional to the measured distance. The eight overlapping bit positions of the fine data signal are provided to the ambiguity resolving system 21 on line 22, as are the eight overlapping bit positions of the coarse data signal on line 24. When so indicated by the ambiguity resolving system 21, a one bit adjustment pulse is provided on line 25 to the three more significant bit positions 26 in the phasemeter 15, and a control signal is provided on line 27 to these three bit positions 26 to indicate whether the adjustment pulse on line 25 should increase or decrease the count in the three more significant bit positions 26 of the coarse data signal by one bit. The adjusted count in the three more significant bit positions 26 is used in forming the composite digital signal at output 20.

Figure 2:
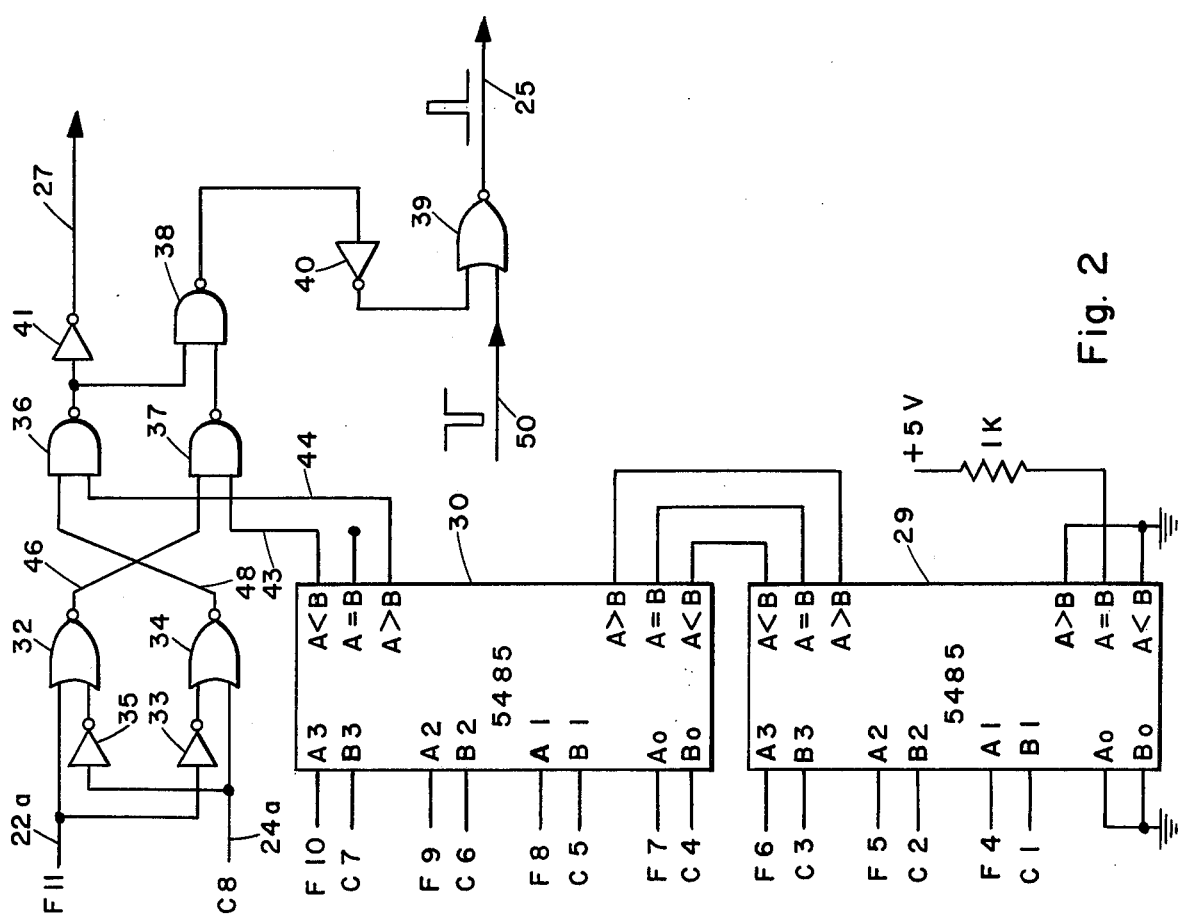
FIG. 2 is a schematic circuit diagram of a preferred embodiment of the ambiguity resolving system of the present invention.
Figure 6:
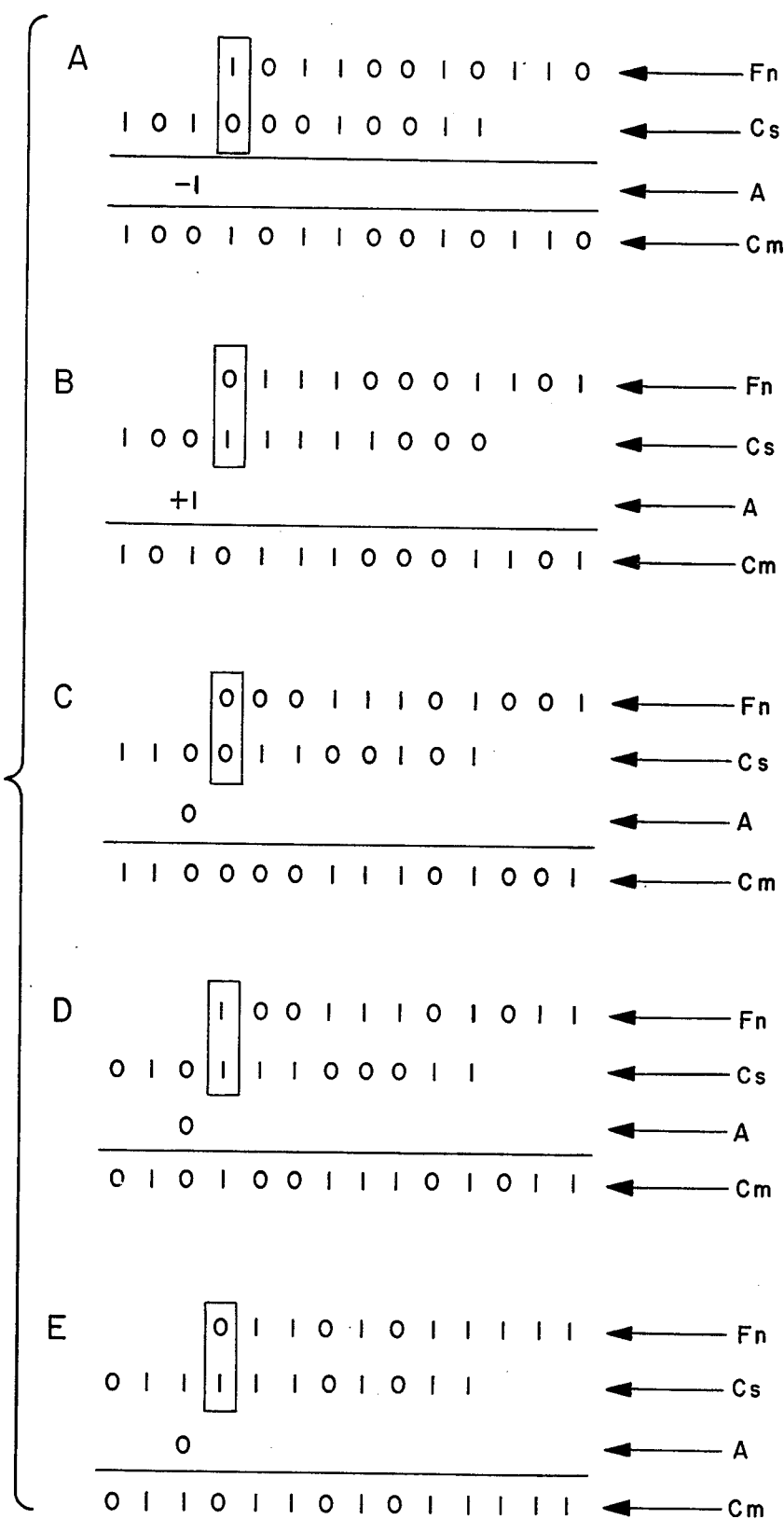
FIGS. 6A through 6E show examples of the adjustments made and the composite digital signals formed when certain different counts are contained in the compared overlapping bit positions of the fine data and coarse data signals.

Referring to FIG. 2, the ambiguity resolving system 21 includes two four-bit magnitude comparators (integrated circuits) 29, 30, and a number of logic components 32-41 (as identified by their standard identifying symbols). The comparators 29, 30 are model number 5485, which is available from such manufacturers as Texas Instruments, National Semiconductors and Signetics.

Referring to FIG. 4, the fine data signal includes bit positions F1 through F11 and the coarse data signal includes bit positions C1 through C11. It is seen that coarse data bit positions C1 through C8 overlap with fine data bit positions F4 through F11. The counts in the most significant bit positions F11 and C8 of the fine data and coarse data signals respectively, are compared with each other. The count in the fine data bit position F11 is provided on line 22a to a NOR gate 32 and through an inverter 33 to a NOR gate 34. The count in the coarse data bit position C8 is provided on line 24a to a NOR gate 34 and through an inverter 35 to a NOR gate 32. The counts in the next lesser significant overlapping bit positions Fc (F4 through F10) and Cc (C1 through C7), of the fine data and coarse data signals respectively, are provided to the inputs of the comparators 29 and 30 as shown in FIG. 2, wherein they are compared.

A logic "1" signal is provided on line 43 from the "A < B" output of the comparator 30 when the count in fine data bit positions Fc is less than the count in coarse data bit positions Cc. A logic 1 signal is provided on line 44 from the "A > B" output of the comparator 30 when the count in fine data bit positions Fc is greater than the count in coarse data bit positions Cc.

A logic 1 signal is provided on line 46 from the NOR gate 32 when the count in fine data bit position F11 is "0" and the count in coarse data bit position is 1, (F11 < C8); and a logic 1 signal is provided on line 48 from the NOR gate 34 when the count in the fine data bit position F11 is 1 and the count in the coarse data bit position is 0, (F11 > C8).

Thus when F11 > C8 and Fc > Cc a logic 0 signal is provided from a NAND gate 36. The inverter 41 inverts this 0 logic signal so as to cause an up/down counter in the coarse data phasemeter 15 to provide a down count when an adjustment pulse appears on line 25. The provision of a logic 0 signal from the NAND gate 36 causes a NAND gate 38 to provide a logic 1 signal, which is inverted by an inverter 40 to cause a NOR gate 39 to provide an adjustment pulse on line 25 when a pulse is provided on line 50. The pulse on line 50 generated upon each comparison, but is delayed to occur after the comparison steps have been completed.

When F11 < C8 and Fc < Cc a logic 0 signal is provided from a NAND gate 37 and causes the NAND gate 38 to provide a logic 1 signal which in turn causes the NOR gate 39 to provide an adjustment pulse on line 25. Since the output from the NAND gate 36 continues to provide a logic 1 signal when F11 < C8 and Fc < Cc, the up/down counter provides an up count when the adjustment pulse appears on line 25.

The system shown in FIG. 2 may be simplified by substituting a model 54153 dual 4-line-to-1-line data selector (integrated circuit) 52 for the logic components 31-42. FIG. 3 shows how the data selector 52 is connected to effect such a substitution.

FIG. 5 is a truth table summarizing the operation of the ambiguity resolving system 21 (FIG. 2). Note that when the counts in bit positions F11 and C8 are the same, i.e., both 1's or both 0's that the comparative counts in the overlapping bit positions Fc and Cc are irrelevant, since no adjustment of the count in coarse data bit positions C9 to C11 is required. However when the counts in bit positions F11 and C8 are not alike, an adjustment may or may not be required depending upon the relative magnitudes of the counts in the overlapping bit positions Fc and Cc. When F11 = 1 and C8 = 0, an adjustment of minus one bit is made to the count in the three more significant coarse data bit positions C9 to C11 only when the count in the fine data bit positions Fc is greater than the count in the coarse data bit positions Cc. Likewise, when F11 = 0 and C8 = 1, an adjustment of plus one count is made to the count in the three more significant coarse data bit positions C9 to C11 only when the count in the fine data bit positions Fc is less than the count in the coarse data bit positions Cc.

To demonstrate the use of this adjustment scheme, the following examples are shown in FIGS. 6A through 6E. Example A shows a −1 bit adjustment "Aj" to the count in the more significant bit positions of the coarse data signal. The 11 bits of the fine data signal are then combined with the three adjusted more significant bits of the coarse data signal to form the 14 bit composite digital signal "Cm". Example B requires a +1 bit adjustment. Examples C and D require no adjustment as shown.

Example E is included to show the limit at which an adjustment can be made. The decision to not adjust may or may not be the correct decision because it cannot be calculated whether the count in the more significant data bit positions C9 to C11 is high or low by 128 bits. If high by 128 bits, adjustment should not be made. However, if it is low by 128 bits, then an adjustment of +1 bit should be made. From this it can be seen that the maximum ambiguity resolving capability is approximately equal to the value of the overlapping bits positions, which for this case of eight overlapping bit positions, equals 255. This is equal to +127 or −127 bits of error.

Having described my invention, I now claim.

1. In a measuring system wherein a "fine" data signal consisting of a first digital signal providing fine measurement data is combined with an overlapping "coarse" data signal consisting of a second digital signal having more significant bit positions providing coarse measurement data to form a composite digital signal representative of a measured quantity, a system for resolving an ambiguity in the counts contained in overlapping bit positions of the fine data and coarse data signals, comprising means for comparing the counts in the overlapping bit positions of the fine data and coarse data signals, and means for adjusting the count in the non-overlapping more significant bit positions of the coarse data signal in accordance with said comparison, wherein the improvement comprises:

the comparing means comprising means for comparing the counts in the most significant overlapping bit position of the fine data and coarse data signals, and means for comparing the counts in the next lesser significant overlapping bit positions of the fine data and coarse data signals; and the adjusting means comprising means for reducing the count in the non-overlapping more significant bit positions of the coarse data signal by one bit when the count in the most significant overlapping bit position of the fine data signal is greater than the count in the most significant overlapping bit position of the coarse data signal and the count in the next lesser significant bit positions of the fine data signal is greater than the count in the next lesser significant bit positions of the coarse data signal, and means for increasing the count in the non-overlapping more significant bit positions of the coarse data signal by one bit when the count in the most significant overlapping bit position of the fine data signal is less than the count in the most significant overlapping bit position of the coarse data signal and the count in the next lesser significant bit positions of the fine data signal is less than the count in the next lesser significant bit positions of the coarse data signal.

2. In a phase shift measuring system wherein a fine data signal consisting of a first digital signal providing fine measurement data is combined with an overlapping coarse data signal consisting of a second digital signal having more significant bit positions providing coarse measurement data to form a composite digital signal representative of a measured phase shift, a system for resolving an ambiguity in the counts contained in overlapping bit positions of the fine data and coarse data signals, comprising means for comparing the counts in the overlapping bit positions of the fine data and coarse data signals, and means for adjusting the count in the non-overlapping more significant bit positions of the coarse data signal in accordance with said comparison, wherein the improvement comprises:

the comparing means comprising means for comparing the counts in the most significant overlapping bit position of the fine data and coarse data signals, and means for comparing the counts in the next lesser significant overlapping bit positions of the fine data and coarse data signals; and the adjusting means comprising means for reducing the count in the non-overlapping more significant bit positions of the coarse data signal by one bit when the count in the most significant overlapping bit position of the fine data signal is greater than the count in the most significant overlapping bit position of the coarse data signal and the count in the next lesser significant bit positions of the fine data signal is greater than the count in the next lesser significant bit positions of the coarse data signal, and means for increasing the count in the non-overlapping more significant bit positions of the coarse data signal by one bit when the count in the most significant overlapping bit position of the fine data signal is less than the count in the most significant overlapping bit position of the coarse data signal and the count in the next lesser significant bit positions of the fine data signal is less than the count in the next lesser significant bit positions of the coarse data signal.

3. In a distance measuring system wherein a fine data signal consisting of a first digital signal providing fine measurement data is combined with an overlapping coarse data signal consisting of a second digital signal having more significant bit positions providing coarse measurement data to form a composite digital signal representative of a measured distance, a system for resolving an ambiguity in the counts contained in overlapping bit positions of the fine data and coarse data signals, comprising means for comparing the counts in the overlapping bit positions of the fine data and coarse data signals, and means for adjusting the count in the non-overlapping more significant bit positions of the coarse data signal in accordance with said comparison, wherein the improvement comprises:

the comparing means comprising means for comparing the counts in the most significant overlapping bit position of the fine data and coarse data signals, and means for comparing the counts in the next lesser significant overlapping bit positions of the fine data and coarse data signals; and the adjusting means comprising means for reducing the count in the non-overlapping more significant bit positions of the coarse data signal by one bit when the count in the most significant overlapping bit position of the fine data signal is greater than the count in the most significant overlapping bit position of the coarse data signal and the count in the next lesser significant bit positions of the fine data signal is greater than the count in the next lesser significant bit positions of the coarse data signal, and means for increasing the count in the non-overlapping more significant bit positions of the coarse data signal by one bit when the count in the most significant overlapping bit position of the fine data signal is less than the count in the most significant overlapping bit position of the coarse data signal and the count in the next lesser significant bit positions of the fine data signal is less than the count in the next lesser significant bit positions of the coarse data signal.

4. In an angle measuring system wherein a fine data signal consisting of a first digital signal providing fine measurement data is combined with an overlapping coarse data signal consisting of a second digital signal having more significant bit positions providing coarse measurement data to form a composite digital signal representative of a measured angle, a system for resolving an ambiguity in the counts contained in overlapping bit positions of the fine data and coarse data signals, comprising means for comparing the counts in the overlapping bit positions of the fine data and coarse data signals, and means for adjusting the count in the non-overlapping more significant bit positions of the coarse data signal in accordance with said comparison, wherein the improvement comprises:

the comparing means comprising means for comparing the counts in the most significant overlapping bit position of the fine data and coarse data signals, and means for comparing the counts in the next lesser significant overlapping bit positions of the fine data and coarse data signals; and the adjusting means comprising means for reducing the count in the non-overlapping more significant bit positions of the coarse data signal by one bit when the count in the most significant overlapping bit position of the fine data signal is greater than the count in the most significant overlapping bit position of the coarse data signal and the count is greater than the count in the next lesser significant bit positions of the coarse data signal, and means for increasing the count in the non-overlapping more significant bit positions of the coarse data signal by one bit when the count in the most significant overlapping bit position of the fine data signal is less than the count in the most significant overlapping bit position of the coarse data signal and the count in the next lesser significant bit positions of the fine data signal is less than the count in the next lesser significant bit positions of the coarse data signal.

* * * * *